(12) United States Patent  
Gollob et al.

(10) Patent No.: US 8,786,255 B2
(45) Date of Patent: Jul. 22, 2014

(54) ACTIVE CHARGE BALANCING CIRCUIT

(75) Inventors: Peter Gollob, Graz (AT); Andreas Pechlaner, Dietramszell (DE); Uschi Pechlaner, legal representative, Dietramszell (DE)

(73) Assignee: Infineon Technologies AG, Neubiberg (DE)

( * ) Notice: Subject to any disclaimer, the term of this patent is extended or adjusted under 35 U.S.C. 154(b) by 336 days.

(21) Appl. No.: 12/772,719

(22) Filed: May 3, 2010

(65) Prior Publication Data

US 2011/0267005 A1 Nov. 3, 2011

(51) Int. Cl.
*H02J 7/00* (2006.01)

(52) U.S. Cl.
USPC .......................... 320/116; 320/118; 320/119

(58) Field of Classification Search
USPC .......................... 320/116, 118, 119
See application file for complete search history.

(56) References Cited

U.S. PATENT DOCUMENTS

| | | | |
|---|---|---|---|
| 5,821,729 A * | 10/1998 | Schmidt et al. | 320/126 |
| 6,373,226 B1 | 4/2002 | Itou et al. | |
| 6,670,789 B2 | 12/2003 | Anzawa et al. | |
| 6,873,134 B2 | 3/2005 | Canter et al. | |
| 7,245,108 B2 * | 7/2007 | Chertok et al. | 320/132 |
| 7,804,276 B2 * | 9/2010 | Roessler | 320/118 |
| 2004/0135545 A1 | 7/2004 | Fowler et al. | |
| 2004/0145351 A1 | 7/2004 | Bernardon et al. | |
| 2005/0017682 A1 | 1/2005 | Canter et al. | |
| 2005/0029987 A1 * | 2/2005 | Lin et al. | 320/119 |
| 2005/0275474 A1 * | 12/2005 | Geynet et al. | 331/36 C |
| 2006/0214636 A1 * | 9/2006 | Arai et al. | 320/116 |
| 2008/0197806 A1 * | 8/2008 | Ridder et al. | 320/119 |
| 2009/0167242 A1 * | 7/2009 | Naganuma et al. | 320/118 |
| 2009/0251145 A1 * | 10/2009 | Kaneko et al. | 324/318 |
| 2010/0123433 A1 * | 5/2010 | Guo | 320/118 |
| 2010/0148726 A1 * | 6/2010 | Lee et al. | 320/118 |
| 2010/0295509 A1 * | 11/2010 | Moussaoui et al. | 320/118 |
| 2011/0140662 A1 * | 6/2011 | Li | 320/116 |

FOREIGN PATENT DOCUMENTS

| | | |
|---|---|---|
| JP | 2009-247515 | 10/1999 |
| JP | 11-355966 | 12/1999 |
| JP | 2001-045672 | 2/2001 |
| JP | 2001-136669 | 5/2001 |
| JP | 2002-223528 | 8/2002 |
| JP | 2006-507790 | 3/2006 |
| JP | 2009-159726 | 7/2009 |
| WO | WO 2004/049540 A2 | 6/2004 |

OTHER PUBLICATIONS

Japanese Patent Application No. 2011-097707, Notice of Reasons for Rejection dated Nov. 13, 2012, 7 pages.

* cited by examiner

*Primary Examiner* — Drew A Dunn
*Assistant Examiner* — Nathaniel Pelton
(74) *Attorney, Agent, or Firm* — Slater & Matsil, L.L.P.

(57) ABSTRACT

A charge balancing circuit and an energy storage arrangement with a charge balancing circuit are disclosed.

25 Claims, 11 Drawing Sheets

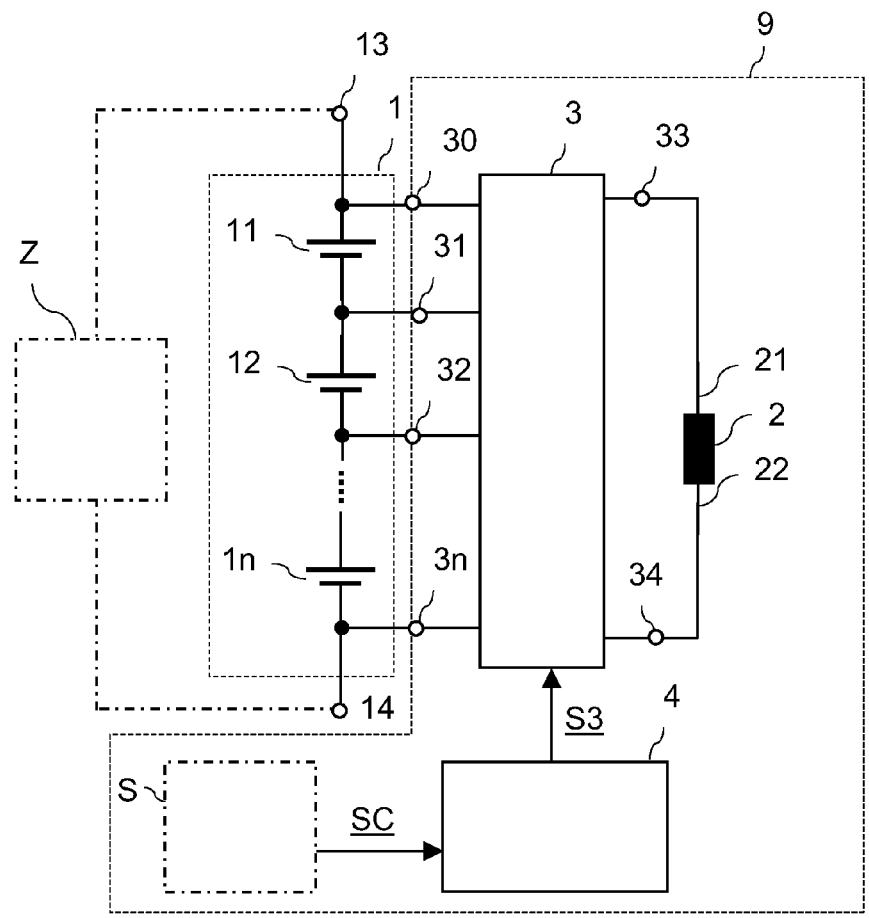
FIG 1
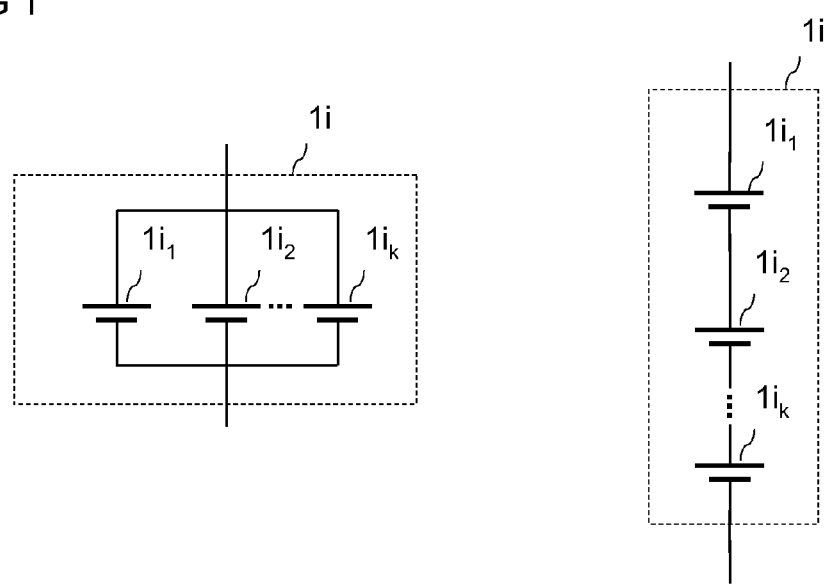
FIG 2A
FIG 2B

ACTIVE CHARGE BALANCING CIRCUIT

TECHNICAL FIELD

The invention relates to a circuit arrangement for charge balancing in a charge storage arrangement that includes a plurality of charge storage cells or accumulators, respectively, connected in series.

BACKGROUND

Accumulators are rechargeable charge storage devices which in a charged state are capable of providing electric power to a load. The output voltage of an accumulator is dependent on the type of accumulator. For lithium-ion accumulators this voltage is about 3.3 V. If it is required to supply loads that require higher supply voltages several accumulators can be connected in series. The supply voltage provided by an accumulator arrangement that includes a number of accumulators connected in series corresponds to the sum of the individual supply voltages of the accumulators connected in series.

Most types of accumulator cells, such as lithium-ion cells, should not be charged so as to have a supply voltage above a given upper voltage limit and should not be discharged so as to have a supply voltage below a given lower voltage limit, in order to prevent degradation or damage. Due to inevitable variations in the manufacturing process of the accumulators the capacitances of the individual accumulators may slightly differ from one another, i.e., the capacitances may be unbalanced. Such unbalance in combination with the upper and lower charging limits may cause problems in terms of both, charging the accumulator arrangement and discharging the accumulator arrangement.

When charging the accumulator arrangement it is known to provide a charging current to the accumulator arrangement, to monitor the voltage across the individual accumulators during the charging process, and to finish the charging process when the voltage across one of the accumulators reaches the upper threshold, which indicates that the corresponding accumulator is completely charged and should not be charged any further. However, when the capacitor with the lowest capacitor reaches its charging limit, i.e., is completely charged, the accumulators having a higher capacity have not been completely charged. Thus, the overall capacity of the accumulator arranged is not completely utilized.

When discharging the accumulator arrangement it is known to stop the discharging process when one of the accumulators reaches its lower voltage limit, i.e., is completely discharged, even if other accumulators could still be discharged.

In order to optimize the useful capacity of an accumulator arrangement the charges stored in the individual accumulators can be balanced during the charging or discharging process. There is, therefore, a need for an efficient and easy to implement charge balancing circuit.

SUMMARY OF THE INVENTION

A first embodiment of the invention relates to a charge balancing circuit, including: a first inductive storage element; and a switch arrangement with a first terminal and a second terminal, at least one control input for receiving at least one control signal, and a plurality of cell terminals. The cell terminals are configured to be connected to taps of a charge storage arrangement that includes a plurality of charge storage cells connected in series. The first inductive storage element is operable to be connected to the first and second terminals of the switch arrangement, and the switch arrangement is configured to selectively connect the first terminal with one of the plurality of cell terminals, and is operable to selectively connect the second terminal with one of the plurality of cell terminals dependent on the at least one control signal, and is configured to enable a current flow between the first and second terminals on the one hand and the cell terminals on the other hand either in a first direction or in an opposite direction dependent on a voltage between the first and second terminals. The charge balancing circuit further includes a control circuit configured to provide the at least one control signal dependent on the state of charge of at least one of the charge storage cells.

A further embodiment relates to an energy storage arrangement with a charge storage arrangement and such a charge balancing circuit.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 1 illustrates a circuit arrangement including an electrical charge storage arrangement with a number of storage cells and a charge balancing circuit for balancing the charge in the storage cells;

FIGS. 2A-2B illustrate embodiments of charge storage cells with a number of charge storage units;

DETAILED DESCRIPTION OF ILLUSTRATIVE EMBODIMENTS

Figure 3A:
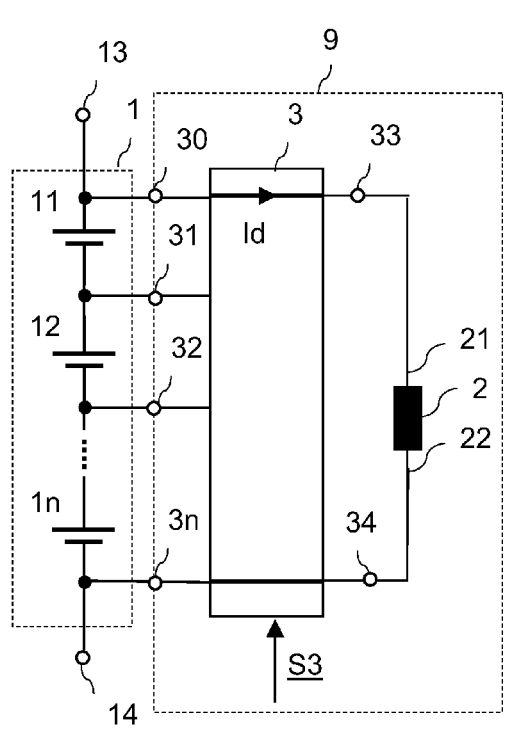
FIGS. 3A-3B schematically illustrate the operating principle of the charge balancing circuit in a bottom-balancing mode.

FIG. 1 shows a diagram illustrating a circuit arrangement with an electrical charge storage arrangement 1. The charge storage arrangement 1 includes a plurality of n electrical charge storage cells 11, 12, 1n connected in series between load terminals 13, 14. The load terminals 13, 14 are configured to have a load or a charging device Z (illustrated in dashed-dotted lines) connected thereto. In operation of the circuit arrangement the charge storage arrangement 1 via the load terminals 13, 14 provides electrical energy to a load Z connected thereto, or receives electrical energy from a charging device Z connected to the load terminals 13, 14. According to a further embodiment, the charge storage arrangement 1 illustrated in FIG. 9 forms a charge storage module that can be used together with other modules of that kind for providing higher supply voltages. In this case the load terminals 13, 14 serve to connect the module with other modules. According to an embodiment a module includes between 8 and 12 storage cells, i.e., n=8.12, and 8 to 12 such modules are connected in series with each other.

The electrical charge storage arrangement 1 may be any type of rechargeable charge storage arrangement, such as a rechargeable battery with a number of battery cells connected in series. In a charged state, each of the charge storage cells 11, 12, 1n is capable of providing a supply voltage, with the overall voltage provided by the charge storage arrangement 1 between the load terminals 13, 14 corresponding to the sum of the individual supply voltages provided by the charge storage cells 11, 12, 1n.

Referring to FIGS. 2A and 2B each of the charge storage cells 11, 12, 1n may include a plurality of charge storage units or single cells. Storage cells $1i$ illustrated in FIGS. 2A and 2B represent any of the storage cells 11, 12, 1n illustrated in FIG. 1. According to FIG. 2A the charge storage cell $1i$ may include a plurality of single cells $1i_1, 1i_2, \ldots 1i_k$ connected in parallel. Referring to FIG. 2B one charge storage cell $1i$ may include a number of single cells $1i_1, 1i_2, \ldots 1i_n$ connected in series. According to further embodiments (not illustrated) one charge storage cell $1i$ includes a parallel circuit with a number of series circuits connected in parallel and/or a series circuit with a number of parallel circuits connected in series.

The single cells $1i_1, 1i_2, \ldots 1i_k$ illustrated in FIGS. 2A and 2B may be any type of rechargeable charge storage units, such as lithium-ion cells, capacitors, etc. It should be mentioned that implementing the charge storage cells 11, 12, 1n to include a plurality of single cells, as illustrated in FIGS. 2A and 2B is only an example. It is also possible to implement the charge storage cells 11, 12, 1n such that they only include one single cell.

In the charge storage arrangement 1 illustrated in FIG. 1 a plurality of n=3 charge storage cells 11, 12, 1n are connected in series. Having n=3 storage cells, however, is only an example. Dependent on the supply voltage the individual storage cells 11, 12, 1n can provide in their charged state and dependent on the supply voltage that is desired to be available between the load terminals 13, 14, the number of charge storage cells connected in series can be selected arbitrarily.

Due to different effects, such as fatigue or wear, or variations in the manufacturing process, the capacitances of the individual storage cells 11, 12, 1n may slightly differ from one another, even in those cases in which the individual storage cells 11, 12, 1n are implemented in an identical manner. Such differences or such unbalance, respectively, in the capacitances has the effect that some storage cells, namely the storage cells having a lower capacitance, are charged faster when the charge storage arrangement 1 is charged and are discharged faster when the charge storage arrangement 1 is discharged than other storage cells, namely storage cells having a higher capacitance.

Since most charge storage cells, such as storage cells including lithium-ion cells, should not be charged to a state of charge above an upper charge limit, and should not be discharged to a state of charge below a lower charge limit, the charging process or the discharging process would have to be stopped when the upper charge limit or the lower charge limit of one of the storage cells is reached, thereby limiting the usable capacitance of the overall arrangement, if no additional measures would be taken.

To compensate for such unbalances of the capacitances of the individual storage cells 11, 12, 1n the circuit arrangement includes a charge balancing circuit 9 that is configured to be connected to taps of the charge storage arrangement 1. "Taps" of the charge storage arrangement 1 are the load terminals 13, 14, which will also be referred to as main taps in the following, and are intermediate taps arranged between two neighboring storage cells. The charge storage arrangement 1 of FIG. 1 besides the two main taps has taps between the storage cells of each pair of neighboring storage cells, so that with n storage cells there are n+1 taps. However, this is only an example. The number of taps could also be less than n+1. According to an embodiment the taps of the storage arrangement include the two main taps and include less than n−1 intermediate taps, so that not between the cells of each pair of neighboring storage cells a tap is arranged.

The charge balancing circuit according to FIG. 1 includes an inductive charge storage element 2, such as a choke. Inductive charge storage element 2 may be implemented with a core or without a core.

The inductive storage element 2 has first and second terminals 21, 22 that are operable to be connected to first and second terminals 33, 34 of a switch arrangement 3, wherein in the embodiment illustrated in FIG. 1 the first and second terminals 21, 22 of the inductive storage element 2 are permanently connected with first and second terminals 33, 34 of the switch arrangement 3. First and second terminals 33, 34 of the switch arrangement 3 will also be referred to as first and second inductor terminals of the switch arrangement 3 hereinbelow.

Switch arrangement 3 further includes cell terminals 30, 31, 32, 3n that are configured to be connected to the taps of the charge storage arrangement 1. The switch arrangement 3 is configured to connect the inductive storage element 2 via the inductor terminals 33, 34 and two of the cell terminals selectively between two taps of the charge storage arrangement 1. The taps to which the first and second terminals 21, 22 of the inductive storage element 2 are to be connected to are given by at least one control signal S3 received at a control input of the switch arrangement 3.

A control circuit 4 controls the charge balancing performed by the charge balancing circuit 9 and generates the at least one control signal S3 dependent on the states of charge of the individual charge storage cells 11, 12, 1n. Control circuit 4 receives at least one state of charge signal SC that represents the states of charge of the individual charge storage cells 11, 12, 1n. According to an embodiment a sensor arrangement S (illustrated in dashed-dotted lines) generates the state of charge signal SC. Sensor arrangement S may be any sensor arrangement that is suitable for detecting the charge states of the individual charge storage cells 11, 12, 1n. According to a first embodiment, sensor arrangement S detects voltages V11, V12, V1n across the charge storage cells 11, 12, 1n and provides the state of charge signal SC dependent on these voltages. Usually, the voltage across the charge storage cells 11, 12, 1n is the lower, the lower the charge state is. Sensor arrangements, such as sensor arrangements S, for evaluating the states of charge of electrical charge storage cells, such as storage cells 11, 12, 1n, are commonly known so that no further explanations are required in this regard. Control circuit 4 is, for example, implemented as a microcontroller. Control circuit 4 is adapted to evaluate the states of charge of the individual charge storage cells 11, 12, 1n and is adapted to control switch arrangement 3 such that a charge unbalance of the charge storage cells 11, 12, 1n is balanced.

The charge balancing circuit 9 illustrated in FIG. 1 is configured to be operated in at least two different charge balancing modes, namely, a bottom-balancing mode in which electrical charge is taken from the overall charge storage arrangement 1 and is fed back to one charge storage cell or to a group of neighboring charge storage cells; and a top-balancing mode, in which electrical charge is taken from one charge storage cell or from a group of neighboring charge storage cells and is fed back to the overall charge storage arrangement 1. Each of these balancing modes includes two steps. In a first step the inductive storage element 2 stores energy resulting from electrical charge taken from the overall arrangement 1 (in the bottom balancing mode), from one charge storage element or from a group of charge storage elements (in the top-balancing mode). In a second step this energy is fed back to one storage element, a group of storage elements or to the overall arrangement. Cycles including these two steps may be repeated several times in order to obtain a desired charge balancing.

The charge balancing circuit 9 of FIG. 1 is easy to implement, because besides an inductive storage element 2 and a control circuit 4 only a switch arrangement 3 with a plurality of switches is required. The switch arrangement is configured to allow a current to flow alternatively in both directions between the first and the second inductor terminals 33, 34 on one hand and two of the cell terminals on the other hand, i.e., either in a first direction or in an opposite direction. The direction in which the current flows between the terminals 33, 34 on the one hand and the cell terminals 30-3n is dependent on the voltage between the inductor terminals 33, 34. For explanation purposes it may be assumed that the switch arrangement 3 connects the inductor terminals 33, 34 with two of the cell terminals in one of the balancing mode. When the voltage between the inductor terminals 33, 34 is higher than a voltage between these two cell terminals, then a current flows in a first direction. In this connection "a current flowing in the first direction" is a current that flows out from the first terminal 33 into the switch arrangement 3 and from the switch arrangement 3 into the second terminal 34. When the voltage between the inductor terminals 33, 34 is lower than a voltage between these two cell terminals, then a current flows in an opposite second direction. In this connection "a current flowing in the second direction" is a current that flows from the switch arrangement 3 into the first terminal 33 and out from the second terminal 34.

Figure 3B:
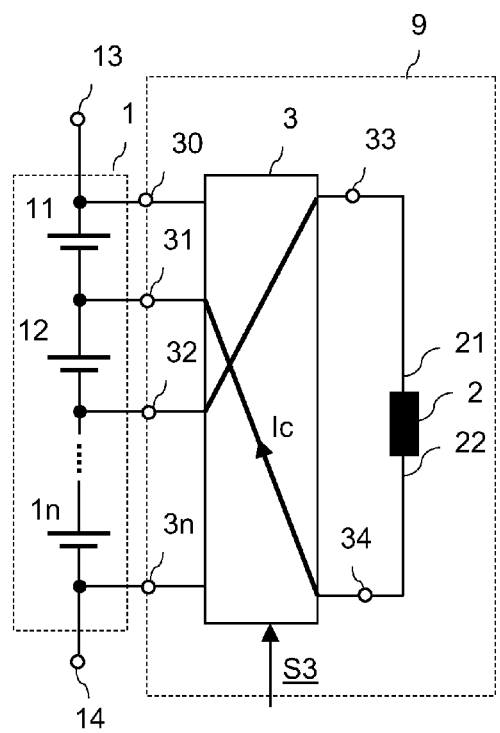

FIGS. 3A and 3B schematically illustrate the operating principle of the charge balancing circuit 9 in the bottom-balancing mode. In a first step, the switch arrangement 3 connects the first and second terminals 21, 22 of the inductive storage element 2 via the inductor terminals 33, 34 and cells terminals 30, 3n with the main taps, that correspond to the load terminals 13, 14, of the charge storage arrangements 1. In FIGS. 3A and 3B switch arrangement 3 is schematically illustrated as a circuit block. The connections between the inductor terminals 33, 34 and the cell terminals 30, 31, 32, 3n in the individual charge balancing steps are illustrated in bold lines.

When the inductive storage element 2 is connected to the load terminals 13, 14 or main taps, respectively, a discharge current Id flow from the charge storage arrangement 1 through the inductive storage element 2. The electrical energy taken from the charge storage arrangement 1 results in a magnetic field in the inductive storage element 2 in which energy is stored in magnetic form. The energy stored in the inductive storage element 2 increases with the duration for which the inductive storage element 2 is connected to the charge storage arrangement 1.

In a next step of the bottom-balancing process the inductive storage element 2 via the inductive terminals 33, 34 and two cell terminals is connected to one of the charge storage cells. In the example illustrated in FIG. 3B the inductive storage element 2 is connected to a second charge storage element 12 of the arrangement 1 by connecting the first and second terminals 33, 34 with cell taps 31, 32 between which the second storage cell 12 is arranged. However, this is only an example. The inductive storage element 2 could be connected to any of the charge storage elements 11, 12, 1n, or could even be connected to a group of neighboring charge storage elements. For connecting the inductive storage element 2 with a group of storage cells the first and second terminals 33, 34 are connected with those cell taps between which a series circuit with the group of neighboring cells are arranged.

According to an embodiment the charge storage element, such as the second charge storage element 12, to which the inductive storage element 2 is connected to in the second step of the bottom-balancing process, is the charge storage element that has been identified to have the lowest charge state of the charge storage elements 11, 12, 1n. When the inductive storage element 2 is connected with one charge storage element or with a group of charge storage elements a charging current Ic resulting from the magnetic energy stored in the inductive storage element 2 flows into the charge storage element or the group of charge storage elements, thereby charging the charge storage element or the group of charge storage elements. The inductive storage element 2 is connected to the charge storage element, such as the second charge storage element 12, such that the charge storage element 2 is charged by the charging current Ic.

The charge storage arrangement 1 and each of the charge storage elements 11, 12, 1n have a positive terminal and a negative terminal. For explanation purposes it may be assumed that the first load terminal 13 is the positive terminal of the charge storage arrangement 1, and that the second load terminal 14 is its negative terminal. The positive terminal of the individual charge storage elements 11, 12, 1n is the terminal that is arranged in the direction of the first load terminal 13, and the negative terminal of the charge storage elements 11, 12, 1n is the terminal arranged in the direction of the second load terminal 14. Between the first step and the second step of the balancing process the polarity of the inductive storage element 2 has to be reversed, i.e., the terminal of the inductive storage element 2 that is connected to a positive terminal of the storage arrangement 1 or a storage cell in the first step has to be connected to the negative terminal of the storage arrangement or a storage cell in the second step. Referring to the example illustrated in FIGS. 3A and 3B this means that the first terminal 21 is connected to the positive terminal 13 of the storage arrangement 1 in the first step, and is connected to the negative terminal of the second storage element 12 in the second step. Equivalently the second terminal 22 of the inductive storage element 2 is connected to the negative load terminal 14 in the first step and is connected to the positive terminal of the second storage element 12 in the second step.

Balancing the charge of one storage cell, such as the second storage cell 12, may include a plurality of balancing cycles with a first step, in which energy is taken from the overall storage arrangement 1, and with a second step, in which energy is fed back to one storage element or to a group of neighboring storage elements.

According to an embodiment the charge states of the individual charge storage elements 11, 12, 1n are evaluated after each balancing cycle. According to a further embodiment a number of balancing cycles is performed before the charge states of the charge storage 11, 12, 1n elements are again evaluated.

The bottom-balancing illustrated in FIGS. 3A and 3B is, for example, suitable when there is one charge storage element that has a charge state that is significantly lower than the charge state of the other charge storage element. In this case the bottom-balancing process helps to increase the charge state of the lowly charged storage element.

Figure 4A:
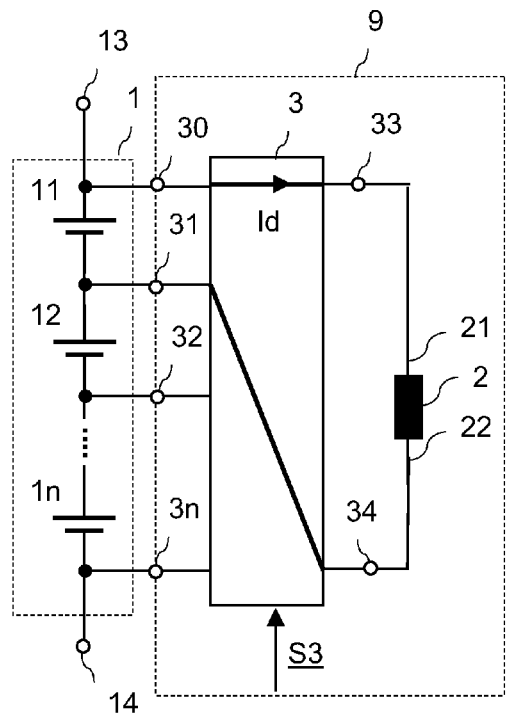
FIGS. 4A-4B schematically illustrate the operating principle of the charge balancing circuit in a top-balancing mode.
Figure 4B:
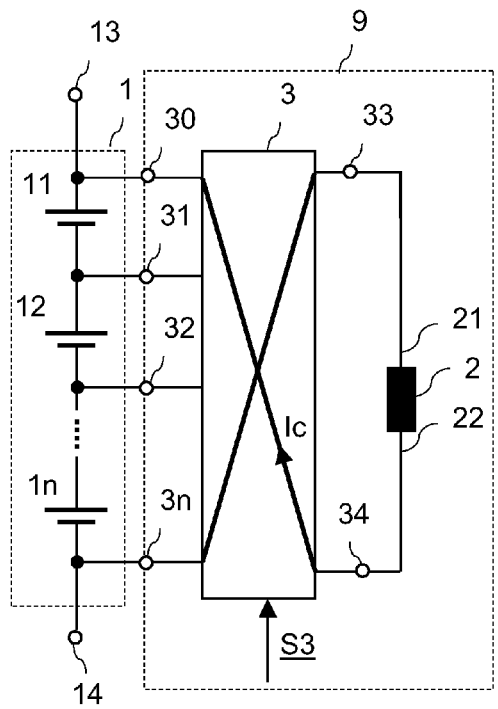

The operating principle of the charge balancing circuit in the top-balancing mode will now be explained with reference to FIGS. 4A and 4B. Referring to FIG. 4A, in a first step energy is taken from one charge storage element, such as a first charge storage element 11. For this, the inductive storage element 2 via the inductor terminals 33, 34 is connected with the cell terminals 30, 31 between which the charge storage element that is to be discharged is connected. Referring to FIG. 4B, in a second step the inductive storage element 2 via the inductive terminals 33, 34 and cell terminals 30, 3n is connected to the load terminals 13, 14 of the charge storage arrangement 1. Through this, the energy preliminary charged in the inductive storage element 2 is fed back into the overall arrangement. This energy fed back into the arrangement is shared amongst the storage cells 11, 12, 1n, so that the energy taken from one storage cell is distributed over several cells.

Like in the bottom-balancing process illustrated in FIGS. 3A, 3B the polarity of the inductive storage element 2 is reversed between the first and second step. Referring to the example illustrated in FIGS. 4A and 4B this means that in the first step the first terminal 21 of the inductive storage element 2 is connected to the positive terminal of the first charge storage element 11, and in the second step is connected to the negative terminal of the charge storage arrangement 1. Thus, a discharge current Id flows from the first charge storage cell 11 in the first step, and a charge current Ic flows into the overall arrangement 1 in the second step. Like in the bottom-balancing mode a number of balancing cycles with a first step, in which energy is taken from one storage cell, and with a second step in which energy is fed back into the overall arrangement, can be performed in order to balance the charge of one charge storage element. Instead of taking energy only from one charge storage element, energy could also be taken from a group of neighboring charge storage elements. In this case the inductive storage element 2 in the first step is connected to those cell terminals of the switch arrangement 3 between which the series circuit with the group of charge storage elements to be discharged is arranged.

The top-balancing mode is, for example, suitable when there is one charge storage element that has a charge state which is significantly higher than the charge state of the other charge storage elements. In this case the highly charge storage element can be discharged in favor of the overall charge storage arrangement 1.

Figure 5A:
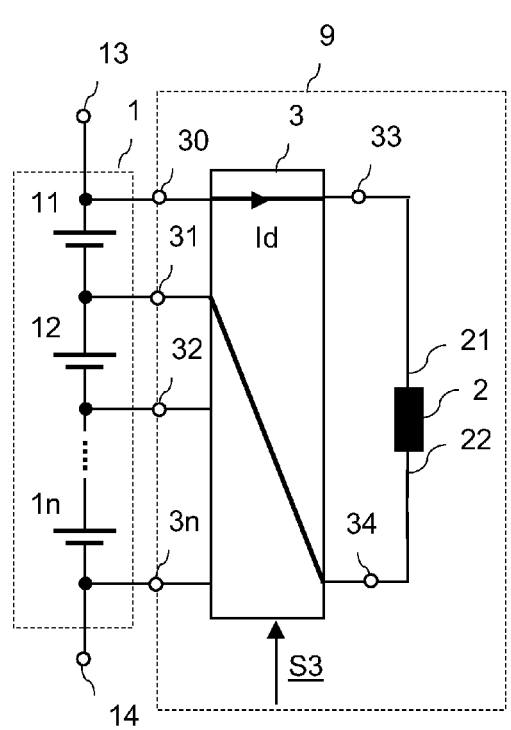
FIGS. 5A-5B illustrate the operating principles of the charge balancing circuit in a cell-to-cell balancing mode.
Figure 5B:
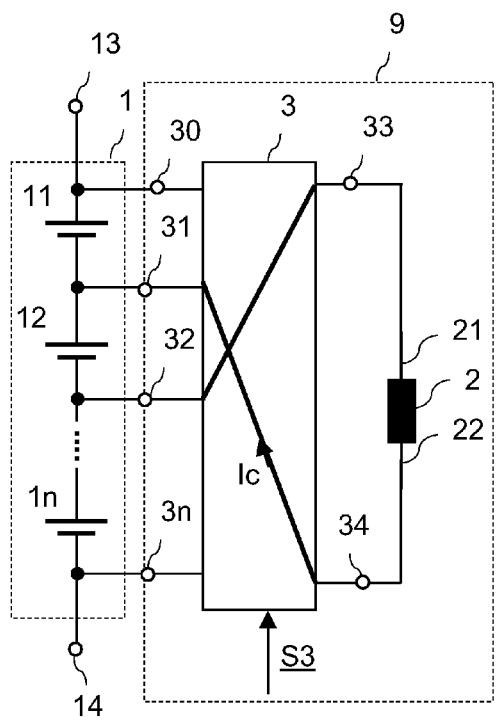

According to one embodiment, the charge balancing circuit 9 is also capable of performing a cell-to-cell balancing mode. In this balancing mode in a first step charge is taken from one storage cell or from one group of neighboring storage cells, and in a second step is fed back to another storage cell or to another group of neighboring storage cells. FIGS. 5A and 5B illustrate the operating principle of the charge balancing circuit 9 in the cell-to-cell balancing mode.

Referring to FIGS. 5A and 5B, in a first step the inductive storage element 2 via the inductor terminals 33, 34 of the switch arrangement 3 and cell terminals of the switch arrangement 3 is connected to a charge storage element that is to be discharged. In the example illustrated in FIG. 5A the first charge storage element 11 is the one to be discharged. In the first step the inductive storage element 2 is connected to those cell terminals 30, 31 of the switch arrangement 3 between which the charge storage element 11 that is to be discharged is arranged.

Referring to FIG. 5B, in a next step the inductive storage element 2 via the switch arrangement 3 is connected to that charge storage element that is to be charged. In the embodiment illustrated in FIG. 5B the charge storage element to be charged is the second charge storage element 12. Therefore, the inductive storage element 2 is connected to the cell terminals 31, 32 of the switch arrangement 2 between which the second charge storage element 12 is arranged. Like in the bottom-balancing mode and the top-balancing mode the polarity of the inductive storage element 2 is to be reversed between the first and the second step. Referring to the example illustrated in FIGS. 5A and 5B this means, that in the first step the first terminal 21 of the inductive storage element 2 is connected to the positive terminal of the first charge storage element 11 and in the second step is connected to the negative terminal of the second charge storage element 12. In the first step a discharge current Id flows from the first charge storage element 11, with the discharge current Id resulting in magnetic energy stored in the inductive storage element 2. In the second step a charge current Ic resulting from the magnetic energy stored in the inductive storage element 2 charges the second charge storage element 12.

Like in the bottom-balancing mode and the top-balancing mode a number of balancing cycles with a first step in which one cell or a group of cells is discharged, and a second step in which another cell or another group of cells is charged, may be performed. The cell-to-cell balancing mode is, for example, suitable in those cases in which there is one charge storage element that has a significantly higher charge state than the other storage cells and in which there is another storage cell that has a significantly lower charge state than the other storage cells. In this case electrical energy is taken from the highly charge storage cell and is provided to the lowly charge storage cell.

The charge balancing modes illustrated with reference to FIGS. 3A to 5B may be performed independent of whether the storage arrangement 1 is an idle mode, i.e., in a mode when the storage arrangement is neither charged by a charging circuit nor discharged in favor of a load, in a charging state in which the storage arrangement is charged by a charging circuit, or in a discharging state in which the storage arrangement is discharged in favor of a load.

According to an embodiment the charge balancing circuit 9 includes a current sensor (not illustrated) that senses the current flowing through the inductive storage element 2. This current sensor provides a current information to the control circuit 4, wherein the control circuit in this embodiment is adapted to disconnect the connection between the inductive storage element 2 and the charge storage arrangement 1 when the current through the inductive storage element 2 has decreased to zero or has decreased to a lower current limit. In this way it is prevented that at the end of the second step energy is taken from the charge storage element or the group of charge storage elements to be charged, such as the second charge storage element in FIG. 3B, the overall charge storage arrangement 1 in FIG. 4B, or the second charge storage element 12 in FIG. 5B.

Figure 6:
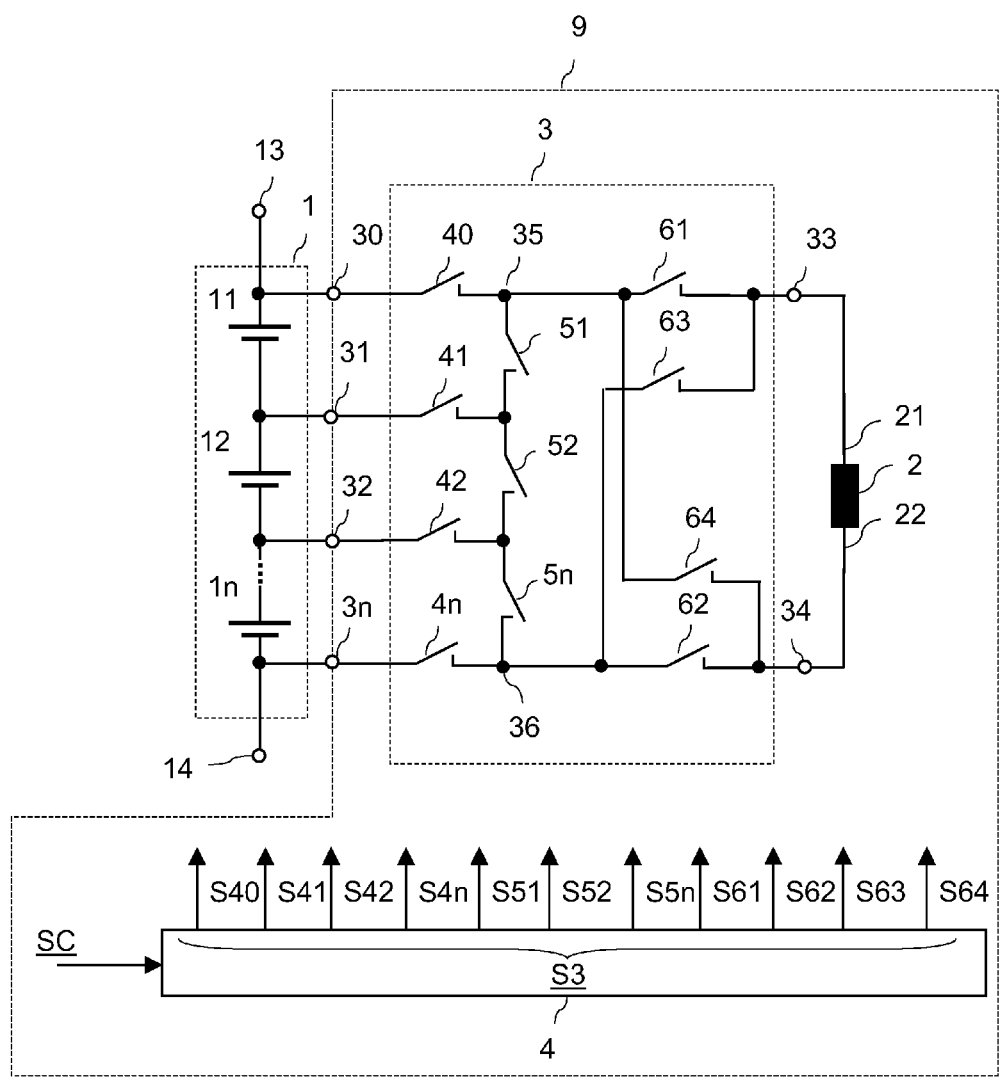
FIG. 6 illustrates a first embodiment of a switch arrangement of the charge balancing circuit.

FIG. 6 illustrates a first embodiment of the switch arrangement 3. The switch arrangement 3 illustrated in FIG. 6 is capable of supporting each of the three balancing modes explained hereinabove. The switch arrangement 3 illustrated in FIG. 6 includes a first group of switches 40, 41, 42, 4n, with each of the switches 40, 41, 42, 4n of the first group having a first terminal connected to one of the cell terminals 30, 31, 32, 3n of the switch arrangement 3. In the embodiment illustrated in FIG. 6 the charge storage arrangement 1 has n charge storage elements 11, 12, 1n and n+1 taps, and the switch arrangement 3 has a cell terminal 30, 31, 32, 3n connected with each of these taps. However, referring to the explanation given with reference to FIG. 1, this is only an example. The number of cell terminals of the switch arrangement 3 could also be less than the number of n+1 taps. In this case not every cell of the storage arrangement can be balanced individually but has to be balanced together with other cells of a group of neighboring storage cells.

The number of switches 40, 41, 42, 4n of the first group correspond to the number of cell terminals of the switch arrangement 3. Referring to FIG. 6, the switch arrangement 3 further includes a second group of switches 51, 52, 5n, where each of these switches 51, 52, 5n of the second group is connected between the second terminals of two switches of the first group. The "second terminals" of the switches of the first group are the terminals of the switches 40, 41, 42, 4n that face away from the cell terminals 30, 31, 32, 3n. In the embodiment of FIG. 6 each of the switches of the second group is connected between two neighboring switches of the first group. "Neighboring switches" of the first group of the switches are those switches that are connected to neighboring cell terminals 30, 31, 32, 3n, where neighboring cell terminals are cell terminals that are connected to neighboring taps of the storage arrangement 1. In the embodiment of FIG. 6 "neighboring taps" of the storage arrangement are taps between which one storage element is arranged.

The switch arrangement 3 further includes internal nodes 35, 36, with each of these internal nodes 35, 36 being a circuit node common to one switch of the first group and one switch of the second group, or being the second terminals of two switches of the first group. In the embodiment illustrated in FIG. 6 a first internal node 35 is the second terminal of that switch 40 of the first group which is connected to that cell terminal 30 that is configured to be connected to the first load terminal 13 of the storage arrangement, and the second internal node 36 is the second terminal of that switch 4n of the first group that is connected to that cell terminal 3n that is configured to be connected to the second load terminal 14. However, this is only an example, the first and second internal terminal 35, 36 could be any second terminal of two different switches of the first group. Via the switches of the first and second group each of the first and second internal nodes 35, 36 can be connected with any of the cell terminals 30, 31, 32, 3n and, thus, with any of the taps of the storage arrangement 1.

Referring to FIG. 6, switch arrangement 3 further includes a third group of switches, with the third group in this embodiment including four switches 61, 62, 63 64. The switches 61-64 of the third group serve to selectively connected the first and second inductor terminals 33, 34 with the first and second internal nodes 35, 36. A first switch 61 of the third group is connected between the first inductive terminal 33 and the first internal node 35, a second switch 62 is connected between the second inductive terminal 34 and the second internal node 36, a third switch 63 is connected between the first inductor terminal 33 and the second internal node 36, and a fourth switch 64 is connected between the second inductor terminal 34 and the first internal node 35. In this embodiment each of the first and second inductor terminals 33, 34 can be connected with each of the first and second internal nodes 35, 36 via the switches of the third group.

The switches of switch arrangement 3 are only schematically illustrated in FIG. 6. These switches are controllable switches that can be switched on and off dependent on control signals provided by the control circuit 4. Further, these switches are selected such that they allow a current to alternatively flow in both directions between the first and the second inductor terminals 33, 34 on one hand and two of the cell terminals on the other hand, i.e., either in a first direction or in an opposite direction. The direction in which the current flows between the terminals 33, 34 on the one hand and the cell terminals is dependent on the voltage between the inductor terminals 33, 34. For explanation purposes is may be assumed that the switch arrangement connects the inductor terminals with two of the cell terminals. When the voltage between the inductor terminals 33, 34 is higher than a voltage between these two cell terminals, then a current flows in a first direction. In this connection "a current flowing in the first direction" is a current that flows out from the first terminal 33 into the switch arrangement 3 and from the switch arrangement 3 into the second terminal 34. When the voltage between the inductor terminals 33, 34 is lower than a voltage between these two cell terminals, then a current flows in an opposite second direction. In this connection "a current flowing in the second direction" is a current that flows from the switch arrangement 3 into the first terminal 33 and out from the second terminal 34.

Control circuit 4 provides a control signal for each of these switches. These control signals are referred to as S40-S64 in FIG. 6. In this embodiment the number following capital letter "S" designates the switch to be controlled by the individual control signal. The plurality of the control signals provided by control circuit 4 form the at least one control signal S3 provided by the control circuit 4 to the switch arrangement 3. The control signals for the individual switches can be transferred to the switch arrangement 3 from the control circuit 4 in parallel. In this case, switch arrangement 3 includes an input port for each of these control signals. According to a further embodiment the switching information for the individual switches are provided to the switch arrangement 3 serially. In this case only one control input is required. In the latter case serial-parallel-interfaces (SPI) are arranged in the control circuit 4 and in the switch arrangement 3, where the interface in the control circuit 4 transforms the parallel data stream represented by the individual control signals into a serial data stream, and in the switch arrangement 3 transforms the serial data stream received from the control circuit 4 back into a parallel data stream. The control signals can each assume two different signal levels, a first signal level representing an on-state of the corresponding switch, and an off-level representing an off-state of the corresponding switch. These signal levels are transmitted from the control circuit 4 to the switch arrangement 3.

Any type of switch can be used to implement the switches of the switch arrangement 3. These types of switches may include semiconductor switches, such as MOSFET, IGBT, or thyristors, or combinations of these switching elements.

The control circuit 4 is adapted to control, dependent on the state of charge signal SC, the switches of the switch arrangement such that one of the charge balancing modes explained herein above with reference to FIGS. 2A to 5B is performed. In order to ease understanding of the operating principle of the switch arrangement 3 of FIG. 6 those switches of the switch arrangement 3 that have to be closed in order to obtain the individual balancing scenarios illustrated in FIGS. 2A-5B will now shortly be explained:

In the first step of the bottom balancing mode illustrated in FIG. 3A the following switches of the switch arrangement 3 have to be closed: 40-61-62-4n. The other switches of the switch arrangement 3 have to be open. The closed switches in the second step of the bottom-balancing mode illustrated in FIG. 3B are: 42-5n-63-64-51-41.

The closed switches in the first step of the top-balancing mode illustrated in FIG. 4A are: 40-61-62-5n-52-41. The closed switches in the second step of the top-balancing mode illustrated in FIG. 4B are: 4n-63-64-40.

The closed switches in the cell-to-cell balancing mode illustrated in FIG. 5A are: 40-61-62-5n-52-41. The closed switches in the cell-to-cell balancing mode illustrated in FIG. 5B are: 42-5n-63-64-51-41.

Figure 7:
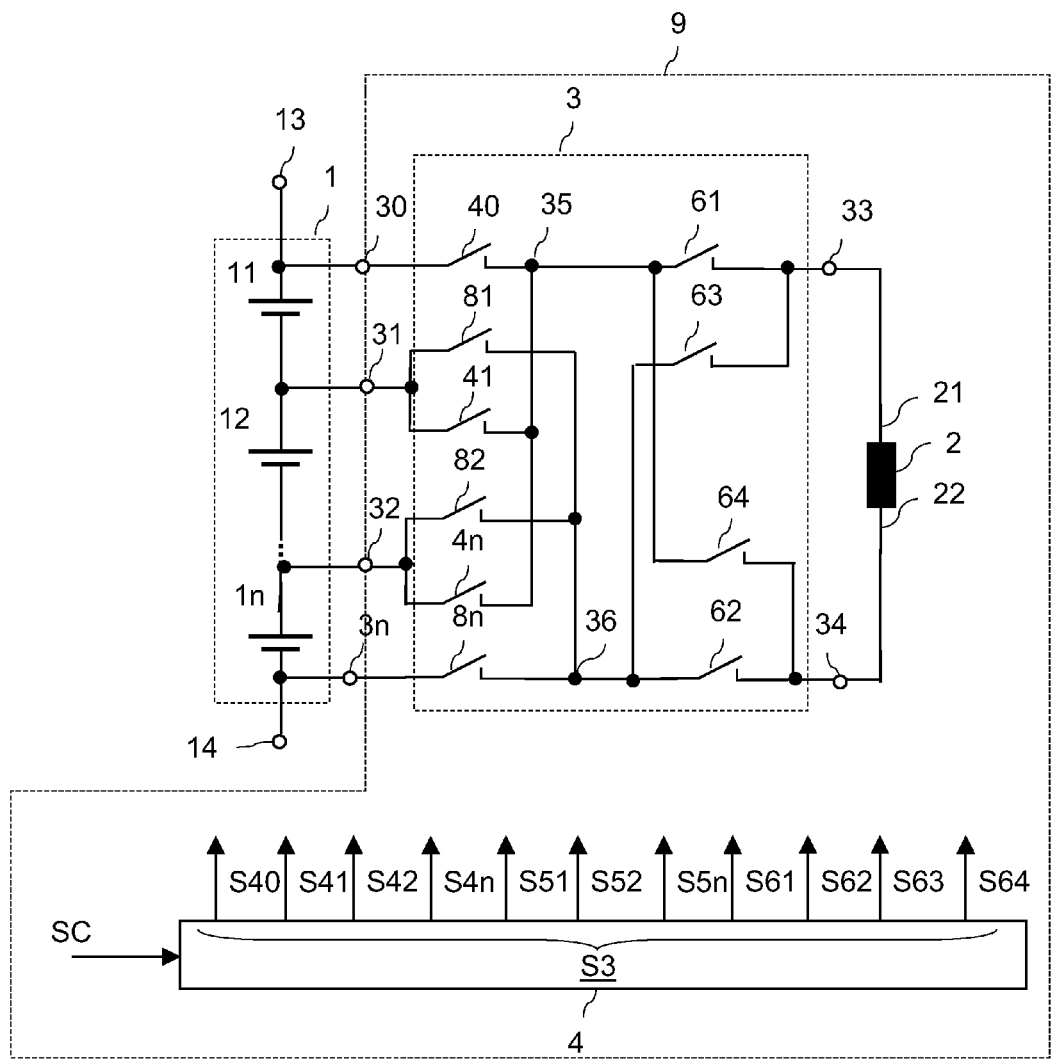
FIG. 7 illustrates a second embodiment of the switch arrangement of the charge balancing circuit.

A second embodiment of a switch arrangement 3 that is capable of supporting each of the three charge balancing modes illustrated with reference to FIG. 2A to 5B is illustrated in FIG. 7.

This switch arrangement 3 includes a first group of switches 40, 41, 4n. A first switch 40 of this first group connects the first internal node 35 with that cell terminal 30 that is configured to be connected to the first load terminal 13, and further switches 41, 4n of the first group connects the first internal node 35 with those cell terminals 31, 32 that are configured to be connected to intermediate taps of the storage arrangement 1. The switch arrangement 3 further includes a second group of switches 81, 82, 8n. The second group includes a first switch 8n connected between the second internal node 36 and that cell terminal 3n that is configured to be connected to the second load terminal 14. The second group further includes additional switches 81, 82, with each of these additional switches being connected between the second internal node 36 and one of the cell terminals 31, 32 configured to be connected to an intermediate tap. The third group of switches 61-64 corresponds to the third group of switches illustrated in FIG. 6. These switches serve to connect the terminals 33, 34 selectively with one of the first and second internal nodes 35, 36. The first internal node 35 of the arrangement in FIG. 7 can be connected to each of the cell terminals 30, 31, 32 that is connected to a positive terminal of a charge storage element, and the second internal node 36 via the switches 81, 82, 8n of the second group can be connected to each of those cell terminals that are configured to be connected to negative terminals of one charge storage cell, where cell terminals 31, 32 that are connected to intermediate taps are connected to both, a positive terminal of one storage cell and a negative terminal of another storage cell.

Like the switch arrangement 3 illustrated in FIG. 6 the switch arrangement 3 of FIG. 7 is capable of supporting each of the three balancing modes illustrated herein above.

Figure 8:
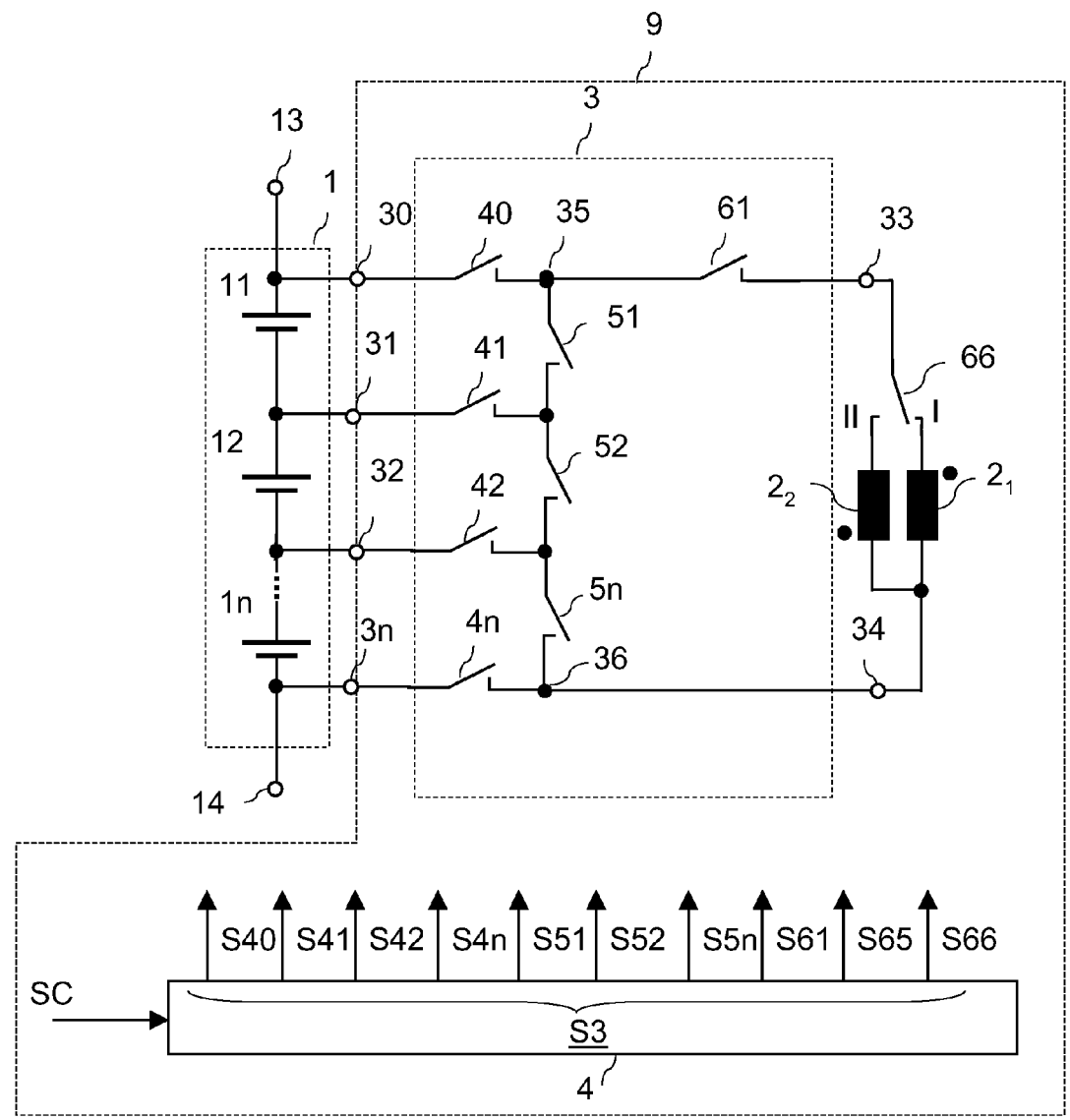
FIG. 8 illustrates a charge balancing circuit with two inductively coupled inductive storage elements.

FIG. 8 illustrates a further embodiment of a charge balancing circuit 9 that is capable of supporting each of the three charge balancing modes explained herein above. This charge balancing circuit 9 is different from the charge balancing circuit explained hereinabove in that instead of one inductive storage element there are two inductive storage elements $2_1$, $2_2$. These inductive storage elements $2_1$, $2_2$ are inductively coupled with each other and have different winding stances. These inductive storage elements are operable to be alternatively connected witch the first and second terminals 33, 34 of the switch arrangement. For this, the inductive storage elements $2_1$, $2_2$ are connected in series with a change-over-switch 66 between the inductive terminals 33, 34 of the switch arrangement 3. Change-over-switch 66 has two switching positions: A first switching position I in which change-over-switch 66 connects the first inductive storage element $2_1$ between the inductive terminals 33, 34; and a second switching position II in which the change-over-switch 66 connects the second inductive storage element $2_2$ between the inductive terminals 33, 34.

The switch arrangement 3 includes a first group of switches 40, 41, 42, 4n and a second group of switches 51, 52, 5n connected between a first and a second internal node 35, 36 and cell terminals 30, 31, 32, 3n of the switch arrangement 3. The first and second groups of switches of the switch arrangement 3 of FIG. 8 correspond to the first and second groups of switches of the switch arrangement 3 in FIG. 6. The explanation given with reference to FIG. 6 concerning these first and second groups of switches apply to the embodiment in FIG. 8 accordingly. In this connection it should be mentioned that the first and second group of switches illustrated in FIG. 8 could be replaced with the first and second group of switches illustrated in FIG. 7 without changing the general operating principle.

In the switch arrangement of FIG. 8 the third group of switches includes only one switch 61 connected between the first inductor terminal 33 and the first internal node 35. The operating principle of the charge balancing circuit 9 illustrated in FIG. 8 will now be explained for the different charge balancing scenarios explained hereinabove with reference to FIGS. 3A to 5B.

In the first step of a bottom-balancing mode, such as bottom-balancing mode illustrated in FIG. 3A, energy is taken from the charge storage arrangement 1 and is stored in one of the inductive storage elements, the first inductive storage element $2_1$, for example. For storing energy in the first inductive storage element $2_1$ the first switch 61 of the third group is closed and the switches of the first and second group of switches are closed such that the first inductor terminal 33 is connected with that cell terminal 30 that is configured to be connected with the first load terminal 13, and these switches are closed such that the second inductor terminal 34 is connected to that cell terminal 3n that is configured to be connected to the second load terminal 14. Thus, in the first step of the bottom-balancing mode change-over switch 66 is in its first position I, and the following switches are closed: 40-61-4n. In the second step of the bottom-balancing mode change-over-switch 66 is switched into its second position II, the first switch 61 of the third group is closed, and the other switches of the switch arrangement 3 are closed such that the inductor terminals 33, 34 are connected to those cell terminals between which the charge storage element that is to be charged is arranged or between which the group of charge storage elements that are to be charged are arranged. For explanation purposes it may be assumed that in the second step of the bottom-balancing mode the second charge storage element 12 is to be charged. In this case the following switches have to be closed: 42-5n-61-51-41.

In the first step of the bottom-balancing mode a discharge current flows from the overall storage arrangement 1, while in the second step a charge current flows into one of the charge storage cells, such as the second charge storage cell 12. The discharge current in the first step and the charge current in the second step flow into opposite directions. This is by the virtue of the fact that the two inductive storage elements $2_1$, $2_2$ have different (opposite) winding senses.

In the first step of a balancing cycle of a top-balancing mode the change-over-switch 66 is again in its first position I. For explanation purposes it may be assumed that in this first step the first charge storage cell 11 is to be discharged. In this case the following switches are closed: 40-61-5n-52-41. In the second step of the cycle of a top-balancing mode the change-over-switch 66 is in its second position II. For charging the overall arrangement 1 in this second step the following switches are closed: 4n-61-40.

For explanation purposes it may be assumed that in a cell-to-cell balancing mode the first charge storage cell 11 is discharged in the first step, and that the second charge storage cell 12 is charged in the second step. In the first step the change-over-switch 66 is in its first position I, and in the second step the change-over-switch 66 is in its second position II. In the first step the following switches are closed: 40-61-5n-52-41. In the second step, for charging the second charge storage element 12, the following switches are closed: 42-5n-61-51-41.

In the example explained before all the other switches that have not explicitly been mentioned to be closed are open.

Like in the circuit arrangement illustrated with reference to FIGS. 6 and 7 switches of the switch arrangement 3 are controlled by the control circuit 4 dependent on the charge states of the individual charge storage cells 11, 12, 1n. Additionally, the switching state of the change-over-switch 66 is also controlled by the control circuit 4. Control signal S66 in FIG. 8 represents the control signal of the change-over-switch 66. Control signal S66 can have two different signal values. A first signal value representing the first switching position I, and a second signal value representing the second switching position II.

Figure 9:
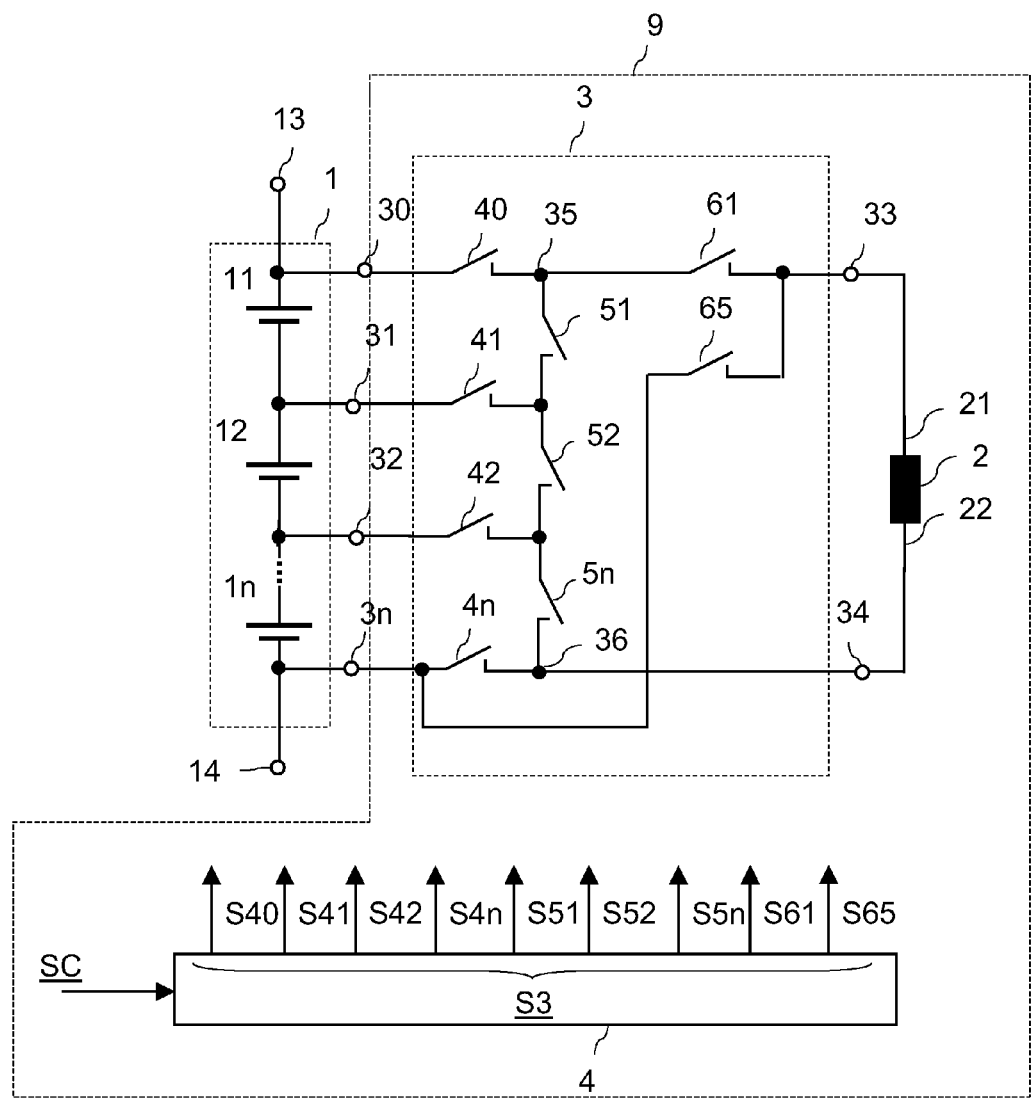
FIG. 9 illustrates a third embodiment of the switch arrangement of the charge balancing circuit.

FIG. 9 illustrates a simplified embodiment of the charge balancing circuit 9 illustrated in FIG. 6. The charge balancing circuit 9 according to FIG. 9 is different from the charge balancing circuit 9 according to FIG. 6 in that the group of third switches includes only two switches. A first switch 61 is connected between the first inductor terminal 33 and the first internal node 35, and a second switch 65 is connected between the first inductor terminal 33 and that cell terminal 3n that is configured to be connected with the second load terminal 14 of the storage arrangement 1. This simplified embodiment of the switch arrangement 3 illustrated in FIG. 9 is capable of supporting a bottom-balancing mode and a top-balancing mode, but is not capable of supporting a cell-to-cell balancing mode.

With reference to the balancing scenarios schematically illustrated in FIGS. 3A to 4B the operating principle of the balancing circuit 9 according to FIG. 9 will now be explained. The balancing circuit 9 of FIG. 9 has a reduced number of switches compared with the balancing circuit in FIG. 6 and does not require any additional inductive storage element. However, a cell-to-cell balancing is not possible with this charge balancing circuit 9. Equivalently, the charge balancing circuit 9 illustrated in FIG. 7 can be reduced to a simplified charge balancing circuit 9 by replacing the switches 61-64 of the third group by the switches 61, 65 illustrated in FIG. 9. A charge balancing circuit 9 obtained through this has the same functionality as the charge balancing circuit illustrated in FIG. 9, i.e. is capable of supporting bottom-balancing and top-balancing, but not cell-to-cell balancing.

Figure 10:
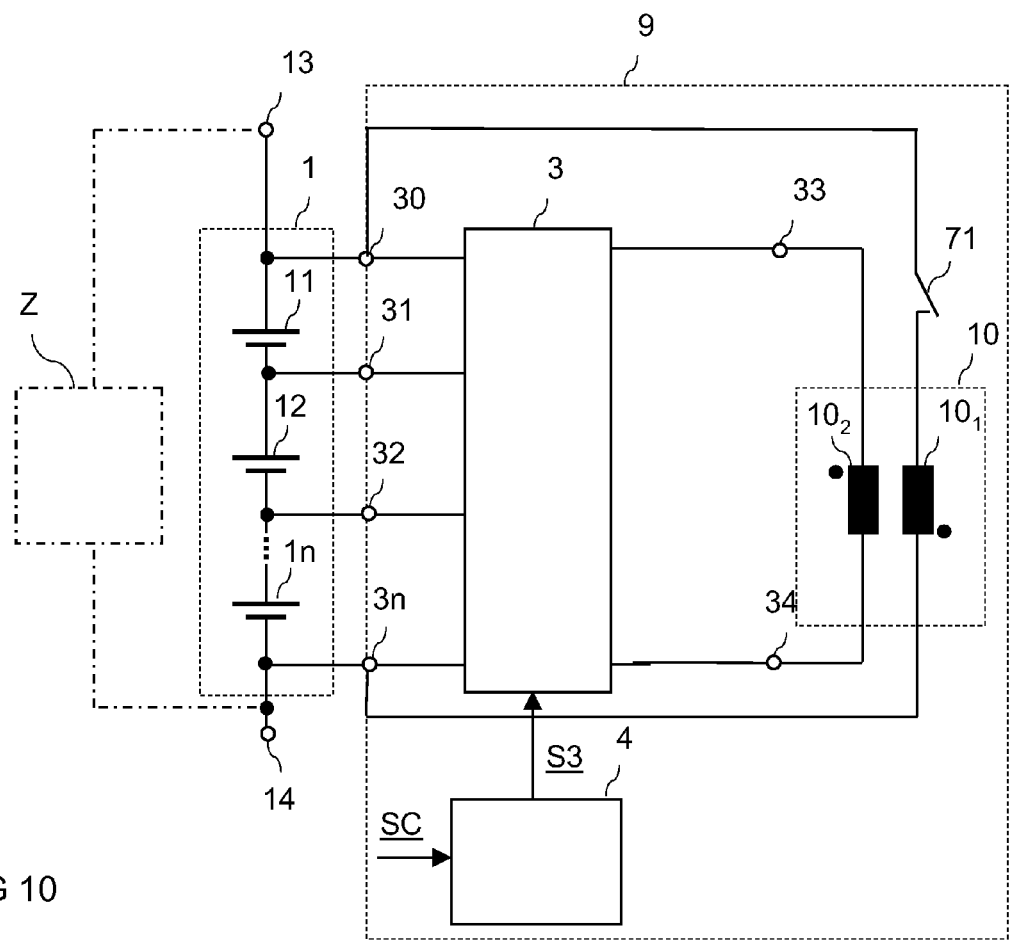
FIG. 10 illustrates a circuit arrangement including an electrical charge storage arrangement and a charge balancing circuit, with the charge balancing circuit including a transformer.

A further embodiment of a charge balancing circuit 9 that is capable of supporting a bottom-balancing or a top-balancing is illustrated in FIG. 10. This charge balancing circuit 9 includes a transformer 10 with a first winding $10_1$ connected in series with a first switch 71. The series circuit with the first switch 71 and the first winding $10_1$ is connected between those cell terminals 30, 3n of a switch arrangement that are configured to be connected to first and second load terminals 13, 14 of the inductive charge storage arrangement 1. The transformer 10 further includes a second inductive storage element $10_2$ which is inductively coupled with the first inductive storage element $10_1$. The first and second inductive storage elements $10_1$, $10_2$ may have opposite winding senses (as illustrated). The second inductive storage element $10_2$ is connected between inductor terminals 33, 34 of a switch arrangement 3. Switch arrangement 3 further includes cell terminals 30, 31, 32, 3n that are configured to be connected to taps of the charge storage arrangement 1. The explanations given hereinabove with reference to taps of the charge storage arrangement apply to the embodiment illustrated in FIG. 10 accordingly. The switch arrangement 3 is adapted to connect the inductor terminals 33, 34 selectively with two of the cell terminals 30, 31, 32, 3n dependent on at least one control signal S3 the switch arrangement 3 receives at least one control input. A control circuit 4 generates the at least one control signal S3 dependent on charge state of the individual charge storage cells 11, 12, 1n.

The charge balancing circuit 9 illustrated in FIG. 10 is adapted to be operated in bottom-balancing mode or in top-balancing mode. In the bottom-balancing mode the first switch 71 connected in series to the first winding $10_1$ is closed in a first step. During this step energy is stored in the first winding $10_1$. In a second step the first switch 71 is opened and the second winding $10_2$ via the inductor terminals 33, 34 is connected with two of the cell terminals 30, 31, 32, 3n via the switch arrangement 3. In this second step energy is transferred from the first winding $10_1$ to the second winding $10_2$ and electrical charge via the inductor terminals 33, 34 and the cell terminal is fed back into one of the charge storage cells or a group of neighboring charge storage cells.

In the top-balancing mode the first switch 71 is opened in a first step. In the first step the second winding $10_2$ via the inductor terminals 33, 34 and the switch arrangement 3 is connected with two of the cell terminals 30, 31, 32, 3n, namely these two cell terminals between which the charge storage element to be discharged is arranged or between which the group of neighboring charge storage elements that are to be discharged are arranged. In the first step energy is stored in the second storage element $10_2$. In the second step the connected between the inductor terminals 33, 34 and the cell terminals is interrupted, and the first switch 71 is closed, so that the energy stored in the second storage element $10_2$, is transferred to the first storage element $10_1$ and causes a charging current flowing via the cell terminals 30, 3n into the overall charge storage arrangement 1.

Figure 11:
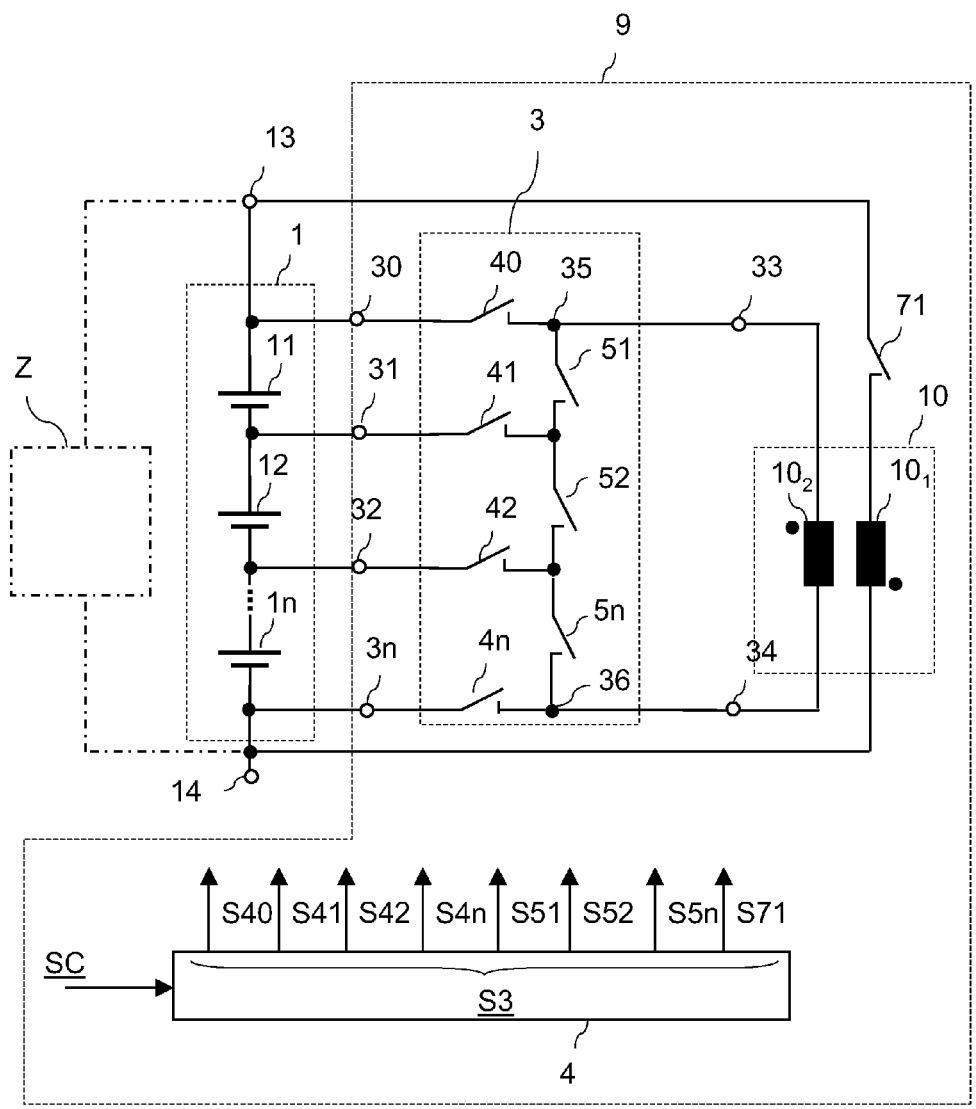
FIG. 11 illustrates a first embodiment of a switch arrangement of the charge balancing circuit of FIG. 10.

FIG. 11 illustrates a first embodiment of the switch arrangement 3. The switch arrangement 3 includes the first group of switches 40, 41, 42, 4n and the second group of switches 51, 52, 5n that have been explained with reference to FIG. 6 herein above. The first and second internal nodes 35, 36 are directly connected with the first and second inductor terminals 33, 34.

Figure 12A:
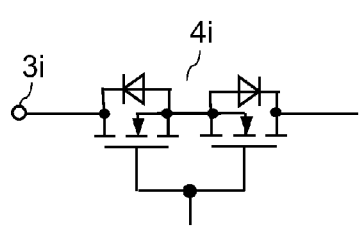
FIGS. 12A-12B illustrate implementation examples of first switches of the switch arrangement.

FIG. 12A illustrates a first example for implementing the first switches 40-4n of the first group. Switching element 4i illustrated in FIG. 12A represents one of these switches 40-4n, and terminal 3i represents the corresponding cell terminal 30-3n of the switch arrangement 3. The switching element 4i includes two MOSFET, namely two n-MOSFET in the example illustrated, having their source terminals connected together and having their gate terminals connected together. The drain terminal of one of the n-MOSFETs is connected with the cell terminal 3i. The diodes connected in parallel with the drain-source paths of the two MOSFETs represent the integrated body diodes of the MOSFET. However, these diodes may also be implemented as additional components, in particular in those cases in which the MOSFETs used do not have an integrated body diode. The MOS- FETs may be made of silicon or any other semiconductor material, such as silicon carbide (SiC) or gallium nitride (GaN).

Figure 12B:
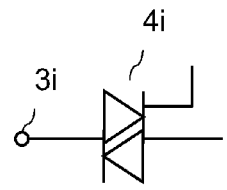

Referring to FIG. 12B, instead of using two MOSFET a TRIAC may be used as a switching element.

Figure 13:
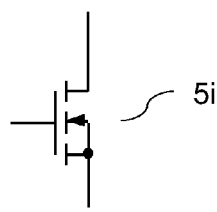
FIG. 13 illustrates an implementation example of second switches of the switch arrangement.

Referring to FIG. 13 the switching elements 51-5n of the second group may be realized as MOSFETs. Switching element 5i illustrated in FIG. 13 represents one of these switching elements of the second group.

Figure 14:
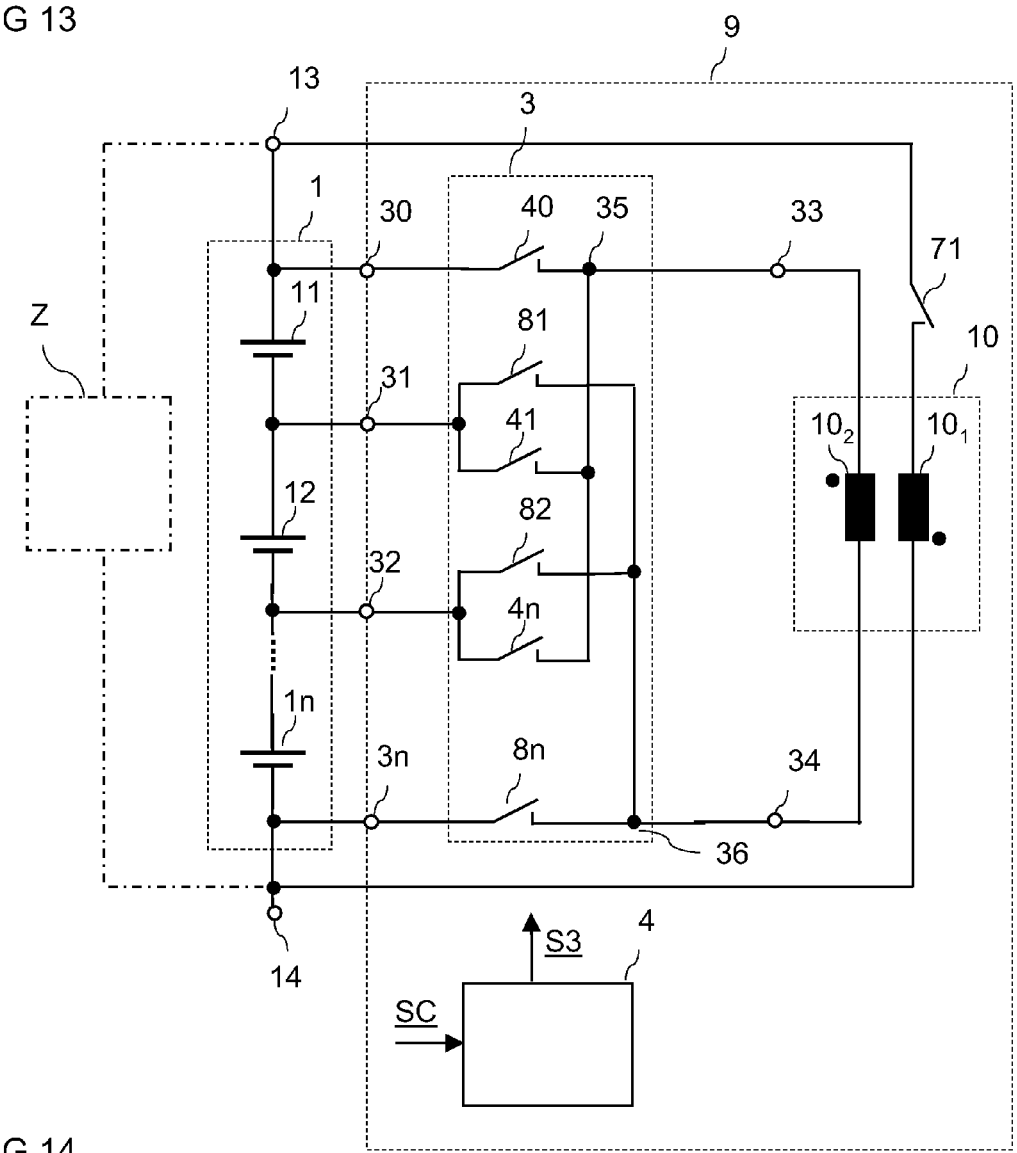
FIG. 14 illustrates a second embodiment of the switch arrangement of the charge balancing circuit of FIG. 10.

FIG. 14 illustrates a further embodiment of a charge balancing circuit 9 according to FIG. 10. In this charge balancing circuit the switch arrangement 3 includes a first group of switches 40-4n and a second group of switches 81-8n that are connected in a way that has been explained herein above with reference to FIG. 7. The first and second internal nodes 35, 36 are directly connected with the first and second inductor terminals 33, 34. The switches 40-4n of the first group and the switches 81-8n of the second group may be implemented like the switching elements that are illustrated in FIGS. 12A and 12B and that have been explained hereinbefore.

In the embodiments illustrated in FIGS. 10, 11 and 14 the first winding 10₁ and the second winding 10₂ of transformer 10 have opposite winding senses, so that energy stored in one of the windings when a switch connected in series with the respective winding is closed, is transferred to the other winding after the switch has been opened.

Figure 15:
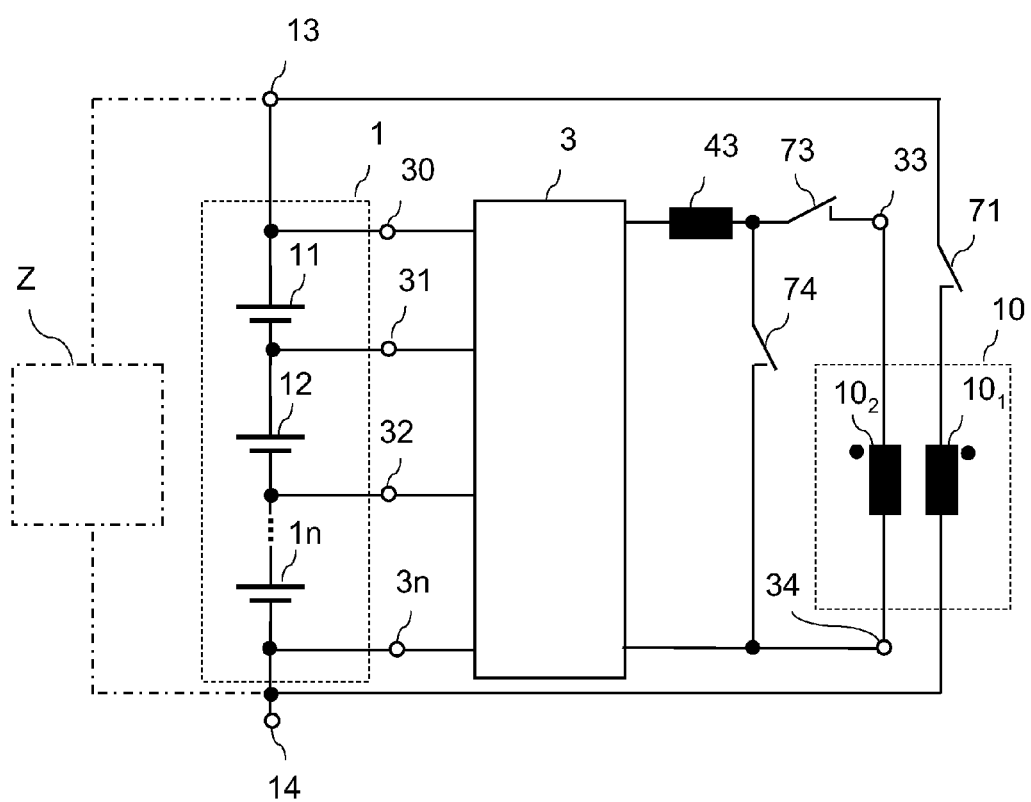
FIG. 15 illustrates a circuit arrangement with a charge balancing circuit according to a further embodiment.

FIG. 15 illustrates a further embodiment of a charge balancing circuit 9. This embodiment is based on the embodiment of FIG. 10 with the difference that the first and the second winding 10₁, 10₂ of the transformer 10 have the same winding sense, so that whenever a current flows through one of the windings, either driven by the storage arrangement 1 or by one or a group of storage cells, a current also flows through the other winding. Further, the second winding 10₂ is connected to the switch arrangement 3 via a series circuit with a second switch 73 and a further inductive storage element 43. A third switch 74 is connected in parallel with a series circuit including the further inductive storage element 43 and the switch arrangement 3. Switch arrangement 3 may be implemented as illustrated in FIG. 11 or 14.

The charge balancing circuit 9 illustrated in FIG. 15 is adapted to be operated in bottom-balancing mode or in top-balancing mode. In the bottom-balancing mode in a first step the first switch 71 connected in series to the first winding 10₁ and the second switch 73 connected in series with the second winding 10₂ are closed, the third switch 74 is opened, and the switch arrangement 3 is driven such that the further inductive storage element 43 is connected in series with the second winding 10₂, and such that the switch arrangement 3 bypasses the storage cells 11, 12, 1n. In this way electrical energy is stored in the further inductive storage element 43.

In a second step the first and second switches 71, 73 are opened, the third switch 74 is closed and the further inductive storage element 43 is connected with two of the cell terminals 30, 31, 32, 3n via the switch arrangement 3. In this second step energy is transferred from the further inductive storage element 43 to one of the charge storage cells or a group of neighboring charge storage cells. In this second step third switch 74 closes the current loop between the switch arrangement 3 and the further inductive storage element 43.

In the top-balancing mode the third switch 74 is closed in a first step and the further inductive storage element 43 via the switch arrangement 3 is connected with one of the storage elements or with a group of storage elements connected in series, so that energy from this storage cell(s) is stored in the further inductive storage element 43. In a second step third switch 74 is opened, the first and second switches 71, 73 are closed and the switch arrangement 3 is driven such that the further inductive storage element 43 is connected in series with the second winding 10₂ and bypasses the storage arrangement 1. The energy stored in the inductive storage element 43 is then transferred via the transformer 10 into the storage arrangement 1.

Finally it should be mentioned that features explained in connection with one embodiment hereinabove can be combined with features of other embodiments, even in those cases in which this has not explicitly mentioned.

What is claimed is:

1. A charge balancing circuit, comprising:
    a switch arrangement comprising a first terminal and a second terminal, at least one control input for receiving at least one control signal, and a plurality of cell terminals, each of the cell terminals being configured to be connected to a tap of a charge storage arrangement that comprises a plurality of charge storage cells connected in series;
    a first inductive storage element coupled to the first and second terminals of the switch arrangement, wherein the switch arrangement is configured to selectively connect the first terminal with one of the plurality of cell terminals, and is operable to selectively connect the second terminal with one of the plurality of cell terminals dependent on the at least one control signal, and is configured to enable a current flow from the first and second terminals to the cell terminals either in a first direction or in a second direction opposite the first direction depending on a voltage between the first and second terminals; and
    a control circuit configured to provide the at least one control signal dependent on a state of charge of at least one of the charge storage cells, operate the switch arrangement in a first charge balancing mode providing electrical charge exchange through the first inductive storage element from any first charge storage cell of the plurality of storage cells to any second charge storage cell of the plurality of storage cells, wherein, during the first charge balancing mode, the control circuit is configured to cause the switch arrangement to connect the first inductive storage element between terminals of the first charge storage cell during a first step and then connect the first inductive storage element between terminals of the second charge storage cell during a second step.

2. The charge balancing circuit of claim 1, further comprising:
    a second inductive storage element, wherein the first and the second inductive storage elements are inductively coupled with each other; and
    a change-over switch configured to selectively connect the first or the second inductive storage element with the first and second terminals of the switch arrangement.

3. The charge balancing circuit of claim 2, wherein the first and the second inductive storage elements comprise coils having opposite winding senses.

4. A charge balancing circuit, comprising:
    a switch arrangement comprising a first terminal and a second terminal, at least one control input for receiving at least one control signal, and a plurality of cell terminals, each of the cell terminals being configured to be connected to a tap of a charge storage arrangement that comprises a plurality of charge storage cells connected in series;
    a first inductive storage element coupled to the first and second terminals of the switch arrangement, wherein the switch arrangement is configured to selectively connect the first terminal with one of the plurality of cell terminals, and is operable to selectively connect the second terminal with one of the plurality of cell terminals dependent on the at least one control signal, and is configured to enable a current flow from the first and second terminals to the cell terminals either in a first direction or in a second direction opposite the first direction depending on a voltage between the first and second terminals; and a control circuit configured to provide the at least one control signal dependent on a state of charge of at least one of the charge storage cells, and configured to operate the switch arrangement in a first charge balancing mode providing electrical charge exchange through the first inductive storage element from any first charge storage cell of the plurality of storage cells to any second charge storage cell of the plurality of storage cells, wherein the switch arrangement comprises a first group of n+1 switches, with n>1, each switch having a first and a second load terminal, the first load terminal being coupled with one tap, a second group of n switches, each of the second switches being connected between the second load terminals of two switches of the first group, a first internal node formed by the second load terminal of one of the switches of the first group, and a second internal node formed by the second load terminal of another one of the switches of the first group, wherein the first and the second internal nodes are operable to be connected with at least one of the first and second terminals of the switch arrangement.

5. The charge balancing circuit of claim 4,
wherein the first internal node is connected with the first terminal of the switch arrangement, and
wherein the second internal node is connected with the second terminal of the switch arrangement.

6. The charge balancing circuit of claim 4, wherein the switches of the first group of switches and the second group of switches comprise bidirectional switches.

7. The charge balancing circuit of claim 4, wherein the switch arrangement further comprises:
a third group of switches with at least one first switch that is operable to connect the first internal node with the first terminal of the switch arrangement.

8. The charge balancing circuit of claim 7, wherein the third group of switches further comprises:
a second switch operable to connect the second internal node with the second terminal of the switch arrangement;
a third switch operable to connect the second internal node with the first terminal of the switch arrangement; and
a fourth switch operable to connect the first internal node with the second terminal of the switch arrangement.

9. The charge balancing circuit of claim 7, wherein the third group of switches further comprises:
a further switch operable to connect the first terminal of the switch arrangement with one of the cell terminals.

10. The charge balancing circuit of claim 1, wherein the switch arrangement comprises:
a first group of n switches, with n>1, each switch having a first and a second load terminal, each switch having the first load terminal coupled with one tap, and the second load terminal coupled to a first internal node; and
a second group of n switches, with n>1, each switch having a first and a second load terminal, each switch having the first load terminal coupled with one tap, and the second load terminal coupled to a second internal node, wherein the first and the second internal nodes are operable to be coupled with at least one of the first and second terminals of the switch arrangement.

11. The charge balancing circuit of claim 10,
wherein the first internal node is coupled with the first terminal of the switch arrangement, and
wherein the second internal node is coupled with the second terminal of the switch arrangement.

12. The charge balancing circuit of claim 10, wherein the switches of the first group of switches and the second group of switches comprise bidirectional switches.

13. The charge balancing circuit of claim 10, wherein the switch arrangement further comprises a third group of switches with at least one first switch that is operable to connect the first internal node with the first terminal of the switch arrangement.

14. The charge balancing circuit of claim 13, wherein the third group of switches further comprises:
a second switch operable to connect the second internal node with the second terminal of the switch arrangement;
a third switch operable to connect the second internal node with the first terminal of the switch arrangement; and
a fourth switch operable to connect the first internal node with the second terminal of the switch arrangement.

15. The charge balancing circuit of claim 13, wherein the third group of switches further comprises a further switch operable to couple the first terminal of the switch arrangement with one of the cell terminals.

16. An energy storage arrangement, comprising:
a charge storage arrangement comprising a plurality of charge storage cells connected in series, and a plurality of taps;
a switch arrangement comprising a first terminal and a second terminal, at least one control input for receiving at least one control signal, and a plurality of cell terminals, each cell terminal being connected to a respective one of the taps of the charge storage arrangement;
a first inductive storage element coupled to the first and second terminals of the switch arrangement, wherein the switch arrangement is configured to selectively connect the first terminal with one of the plurality of cell terminals, and is operable to selectively connect the second terminal with one of the plurality of cell terminals dependent on the at least one control signal, and is configured to enable a current flow in both directions from the first and second terminals to the cell terminals; and
a control circuit configured to provide the at least one control signal dependent on a state of charge of at least one of the charge storage cells, and configured to operate the switch arrangement in a first charge balancing mode providing electrical charge exchange through the first inductive storage element from any first charge storage cell of the plurality of storage cells to any second charge storage cell of the plurality of storage cells, wherein, during the first charge balancing mode, the control circuit is configured to cause the switch arrangement to connect the first inductive storage element between terminals of the first charge storage cell during a first step and then connect the first inductive storage element between terminals of the second charge storage cell during a second step.

17. The energy storage arrangement of claim 16, further comprising:

a second inductive storage element, wherein the first and the second inductive storage elements are inductively coupled with each other; and a change-over switch configured to selectively connect the first or the second inductive storage element with the first and second terminals of the switch arrangement.

18. An energy storage arrangement, comprising:

a charge storage arrangement comprising a plurality of charge storage cells connected in series, and a plurality of taps;

a switch arrangement comprising a first terminal and a second terminal, at least one control input for receiving at least one control signal, and a plurality of cell terminals, each cell terminal being connected to a respective one of the taps of the charge storage arrangement;

a first inductive storage element coupled to the first and second terminals of the switch arrangement, wherein the switch arrangement is configured to selectively connect the first terminal with one of the plurality of cell terminals, and is operable to selectively connect the second terminal with one of the plurality of cell terminals dependent on the at least one control signal, and is configured to enable a current flow in both directions from the first and second terminals to the cell terminals; and a control circuit configured to provide the at least one control signal dependent on a state of charge of at least one of the charge storage cells, and configured to operate the switch arrangement in a first charge balancing mode providing electrical charge exchange through the first inductive storage element from any first charge storage cell of the plurality of storage cells to any second charge storage cell of the plurality of storage cells, wherein the switch arrangement comprises a first group of n+1 switches, with n>1, each switch having a first and a second load terminal, the first load terminal being coupled with one tap, a second group of n switches, each of the second switches being connected between the second load terminals of two switches of the first group, a first internal node formed by the second load terminal of one of the switches of the first group, and a second internal node formed by the second load terminal of another one of the switches of the first group, wherein the first and the second internal nodes are operable to be connected with at least one of the first and second terminals of the switch arrangement.

19. The energy storage arrangement of claim 16, wherein the switch arrangement comprises:

a first group of n switches, with n>1, each switch having a first and a second load terminal, each switch having the first load terminal coupled with one tap, and the second load terminal coupled to a first internal node; and a second group of n switches, with n>1, each switch having a first and a second load terminal, each switch having the first load terminal coupled with one tap, and the second load terminal coupled to a second internal node, wherein the first and the second internal nodes are operable to be coupled with at least one of the first and second terminals of the switch arrangement.

20. The charge balancing circuit of claim 1, further comprising the charge storage arrangement.

21. The charge balancing circuit of claim 1, wherein the control circuit is further configured to operate the switch arrangement in a second charge balancing mode providing electrical charge exchange through the first inductive storage element from any first cell of the plurality of charge storage cells to all cells of the plurality of charge storage cells.

22. The charge balancing circuit of claim 1, wherein the control circuit is further configured to operate the switch arrangement in a third charge balancing mode providing electrical charge exchange through the first inductive storage element from all cells of the plurality of charge storage cells to any first cell of the plurality of charge storage cells.

23. A method of operating a charge balancing circuit comprising:

determining at least one control signal for a switch arrangement based on a state of charge of at least one energy storage element of a plurality of energy storage elements;

reconfiguring the switch arrangement according to the at least one control signal; and configuring the switch arrangement to perform a first charge balancing mode providing electrical charge exchange through a first inductive storage element from any first energy storage element of the plurality of energy storage elements to any second energy storage element of the plurality of energy storage elements, wherein configuring the switch arrangement to perform the first charge balancing mode comprises causing the switch arrangement to connect the first inductive storage element between terminals of the first energy storage element during a first step, and causing the switch arrangement to connect the first inductive storage element between terminals of the second energy storage element during a second step after the first step.

24. The method according to claim 23, further comprising configuring the switch arrangement to perform a second charge balancing mode providing electrical charge exchange through the first inductive storage element from any first energy storage element of the plurality of storage elements to all of the plurality of energy storage elements.

25. The method according to claim 23, further comprising configuring the switch arrangement to perform a third charge balancing mode providing electrical charge exchange through the first inductive storage element all of the plurality of energy storage elements to any first energy storage element of the plurality of energy storage elements.

* * * * *